United States Patent
Kadav et al.

(10) Patent No.: US 10,832,136 B2
(45) Date of Patent: *Nov. 10, 2020

(54) PASSIVE PRUNING OF FILTERS IN A CONVOLUTIONAL NEURAL NETWORK

(71) Applicant: NEC Laboratories America, Inc., Princeton, NJ (US)

(72) Inventors: Asim Kadav, Jersey City, NJ (US); Igor Durdanovic, Lawrenceville, NJ (US); Hans Peter Graf, Lincroft, NJ (US); Hao Li, Silver Spring, MD (US)

(73) Assignee: NEC Corporation (JP)

( * ) Notice: Subject to any disclaimer, the term of this patent is extended or adjusted under 35 U.S.C. 154(b) by 791 days.

This patent is subject to a terminal disclaimer.

(21) Appl. No.: 15/590,620

(22) Filed: May 9, 2017

(65) Prior Publication Data
US 2017/0337471 A1    Nov. 23, 2017

Related U.S. Application Data

(60) Provisional application No. 62/338,797, filed on May 19, 2016, provisional application No. 62/338,031, filed on May 18, 2016.

(51) Int. Cl.
| | | |
|---|---|---|
| G06N 3/08 | (2006.01) | |
| G06N 3/04 | (2006.01) | |
| G06K 9/62 | (2006.01) | |
| G06K 9/00 | (2006.01) | |
| G06K 9/46 | (2006.01) | |
| G08B 13/00 | (2006.01) | |
| G08B 29/18 | (2006.01) | |

(Continued)

(52) U.S. Cl.
CPC .......... *G06N 3/082* (2013.01); *G06F 17/153* (2013.01); *G06F 17/17* (2013.01); *G06K 9/00771* (2013.01); *G06K 9/4628* (2013.01); *G06K 9/627* (2013.01); *G06K 9/6228* (2013.01); *G06K 9/6296* (2013.01); *G06K 9/66* (2013.01); *G06N 3/0454* (2013.01); *G08B 13/00* (2013.01); *G08B 29/186* (2013.01); *G06K 2009/00738* (2013.01); *G06N 3/0427* (2013.01); *G06N 3/0481* (2013.01); *G06N 5/045* (2013.01); *H03H 2222/04* (2013.01)

(58) Field of Classification Search
None
See application file for complete search history.

(56) References Cited

U.S. PATENT DOCUMENTS

2016/0358070 A1 * 12/2016 Brothers .............. G06N 3/0454

OTHER PUBLICATIONS

A. Polyak and L. Wolf, "Channel-level acceleration of deep face representations," in IEEE Access, vol. 3, pp. 2163-2175, 2015. (Year: 2015).*

(Continued)

*Primary Examiner* — Eric Nilsson
*Assistant Examiner* — Yao David Huang
(74) *Attorney, Agent, or Firm* — Joseph Kolodka

(57) ABSTRACT

Methods and systems for pruning a convolutional neural network (CNN) include calculating a sum of weights for each filter in a layer of the CNN. The filters in the layer are sorted by respective sums of weights. A set of m filters with the smallest sums of weights is filtered to decrease a computational cost of operating the CNN. The pruned CNN is retrained to repair accuracy loss that results from pruning the filters.

15 Claims, 3 Drawing Sheets

(51) Int. Cl.
  G06F 17/15    (2006.01)
  G06F 17/17    (2006.01)
  G06K 9/66     (2006.01)
  G06N 5/04     (2006.01)

(56) References Cited

OTHER PUBLICATIONS

S. Zheng et al., "Conditional Random Fields as Recurrent Neural Networks," 2015 IEEE International Conference on Computer Vision (ICCV), Santiago, 2015, pp. 1529-1537. (Year: 2015).*

Anwar et al., "Structured Pruning of Deep Convolutional Neural Networks," arXiv:1512.08571 [cs.NE], 2015 (Year: 2015).*

Han et al., "Learning both Weights and Connections for Efficient Neural Networks," arXiv:1506.02626 [cs.NE], 2015 (Year: 2015).*

G. Castellano, A. M. Fanelli and M. Pelillo, "An iterative pruning algorithm for feedforward neural networks," in IEEE Transactions on Neural Networks, vol. 8, No. 3, pp. 519-531, May 1997. (Year: 1997).*

R. Reed, "Pruning Algorithms—A survey," in IEE transactions on Neural Networks, vol. 5, No. 5, pp. 740-747, 1993. (Year: 1993).*

S. Anwar, K. Hwang and W. Sung, "Fixed point optimization of deep convolutional neural networks for object recognition," 2015 IEEE International Conference on Acoustics, Speech and Signal Processing (ICASSP), Brisbane, QLD, 2015, pp. 1131-1135. (Year: 2015).*

Yann Le Cun et al., Optimal Brain Damage, Advances in neural information processing systems 2, Jun. 1990 pp. 598-605.

Song Han et al., Learning both Weights and Connections for Efficient Neural Network, Neural and Evolutionary Computing, Oct. 2015.

Adam Polyak et al., Channel-Level Acceleration of Deep Face Representations, Special Section on Applying Four Ds of Machine Learning to Advance Biometrics, Nov. 2015.

* cited by examiner

PASSIVE PRUNING OF FILTERS IN A CONVOLUTIONAL NEURAL NETWORK

RELATED APPLICATION INFORMATION

This application claims priority to U.S. Patent Application No. 62/338,031, filed on May 18, 2016, and 62/338,797, filed on May 19, 2016, incorporated herein by reference in its entirety. This application is related to an application entitled, "SECURITY SYSTEM USING A CONVOLUTIONAL NEURAL NETWORK WITH PRUNED FILTERS," Ser. No. 15/590,666, which is incorporated by reference herein in its entirety.

BACKGROUND

Technical Field

The present invention relates to neural networks and, more particularly, to filter pruning in convolutional neural networks.

Description of the Related Art

As convolutional neural networks (CNNs) grow deeper (i.e., involve progressively more layers), the cost of computing inferences increases with the number of parameters and convolution operations involved. These computational costs are particularly relevant when dealing with embedded sensors and mobile devices where computational and power resources are limited. High inference costs post a similar barrier in contexts where high responsiveness and low latency are needed.

Existing approaches to reducing the storage and computation costs involve model compression by pruning weights with small magnitudes and then retraining the model. However, pruning parameters does not necessarily reduce computation time, because the computation cost is low. In addition, the resulting sparse models lack optimizations that make computations practical.

SUMMARY

A method for pruning a convolutional neural network (CNN) includes calculating a sum of weights for each filter in a layer of the CNN. The filters in the layer are sorted by respective sums of weights. A set of m filters with the smallest sums of weights is pruned to decrease a computational cost of operating the CNN. The pruned CNN is retrained to repair accuracy loss that results from pruning the filters.

A method for pruning a CNN includes calculating a sum of weights for each filter in a layer of the CNN. The filters in the layer are sorted by respective sums of weights. A number of filters m is selected based on a sensitivity of the layer to pruning, measured as a degree of accuracy change. A set of m filters with the smallest sums of weights is pruned to decrease a computational cost of operating the CNN. Feature maps corresponding to the m pruned filters are pruned. Kernels in a subsequent layer that correspond to the pruned feature maps are pruned. The pruned CNN are retrained to repair accuracy loss that results from pruning the filters.

A system for pruning a CNN includes a pruning module having a processor configured to calculate a sum of weights for each filter in a layer of the CNN, to sort the filters in the layer by respective sums of weights, and to prune m filters with the smallest sums of weights to decrease a computational cost of operating the CNN. A training module is configured to retrain the pruned CNN to repair accuracy loss that results from pruning the filters.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, systems and methods are provided for passive pruning of filters in convolutional neural networks (CNNs). Rather than pruning parameters, the present embodiments reduce the computational cost of trained CNNs by pruning filters. Pruning filters does not introduce sparsity and therefore does not necessitate the use of sparse libraries or specialized hardware. The number of filters that are pruned correlates directly with computational acceleration by reducing the number of matrix multiplications. In addition, instead of layer-wise iterative fine-tuning, one-shot pruning and retaining may be used to save retraining time when pruning filters across multiple layers.

CNNs are extensively used in image and video recognition, natural language processing, and other machine learning processes. CNNs use multi-dimensional layers of weights to create filters that have small spatial coverage but that extend through the full depth of an input volume. To use the example of an image input, the individual pixels represent the width and height of the input, while the number of colors (e.g., red, green, and blue) represent the depth. Thus, a filter in a CNN being used to process image data would apply to a limited number of pixels but would apply to all of the color information for those pixels. The filter is convolved across the width and height of the input volume, with dot products being calculated between entries of the filter and the input at each position.

The present embodiments prune low-magnitude convolutional filters and those that are not activated frequently (i.e., filters which have a low absolute magnitude of weights) from the CNN. Convolutional filters that are infrequently activated are driven down to zero. This results in an efficient network that involves fewer convolutional operations.

Figure 1:
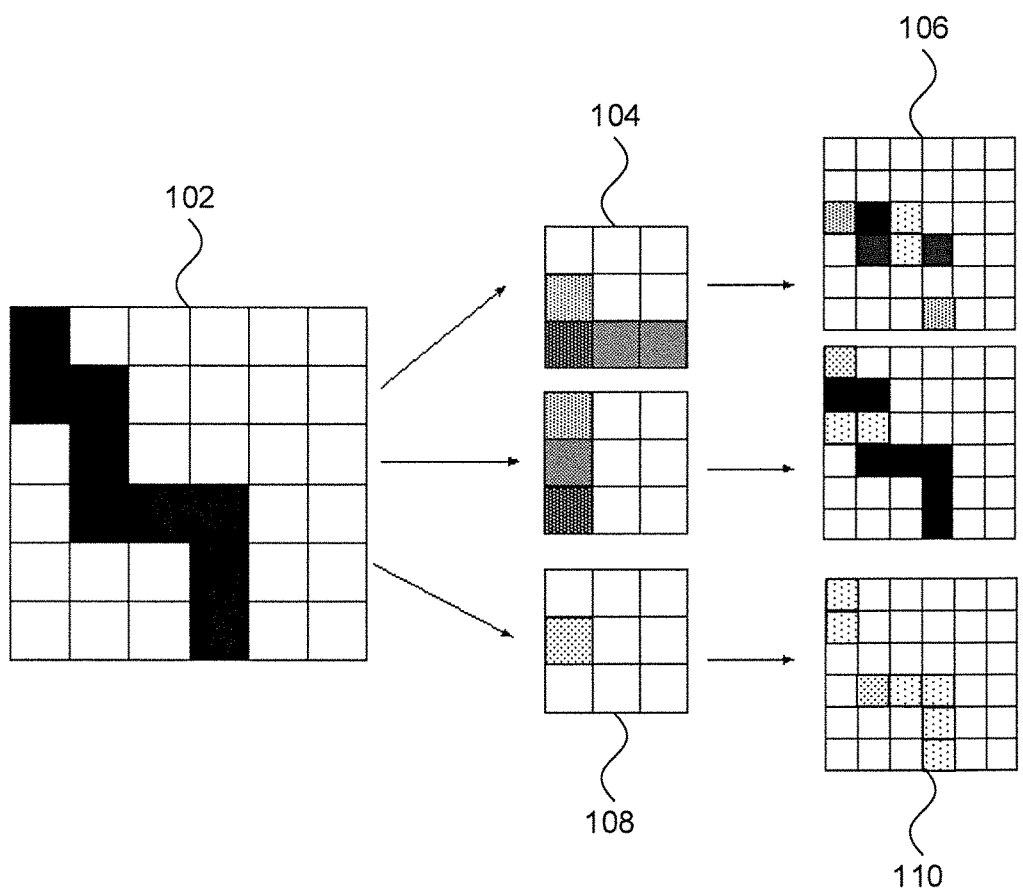
FIG. 1 is a diagram showing the correspondence between an input, filters, and feature maps in a convolutional neural network (CNN) system in accordance with the present embodiments.

Referring now in detail to the figures in which like numerals represent the same or similar elements and initially to FIG. 1, a diagram of the steps performed in a CNN calculation is shown. The input volume 102 may represent, for example, an image, a frame of video, a document, or any other appropriate set of multi-dimensional input data. Each of a set of filters is convolved with the entire input volume 102 to generate feature maps 106. Depending on the weights of the filters 104, the filters 104 may be low in magnitude and can generate feature maps with limited activations.

In the example of FIG. 1, the third filter 108 is a low-magnitude filter. This low-magnitude filter 108 produces a feature map 110 that has limited activations. By the present embodiments, low-magnitude filters 108 may be removed. This cuts down substantially on the computational cost of using the CNN, while the loss of the weak feature maps 110 will not significantly affect the outcome.

Let $n_i$ denote the number of input channels for the $i^{th}$ convolutional layer of a CNN. The height and width of the input feature maps are denoted as $h_i$ and $w_i$ respectively. The convolutional layer transforms the input feature maps $x_i \in \mathbb{R}^{n_i \times h_i \times w_i}$ into the output feature maps $x_{i+1} \in \mathbb{R}^{n_{i+1} \times h_{i+1} \times w_{i+1}}$, which are used as input feature maps for the next convolutional layer. This is achieved by applying $n_{i+1}$ 3D filters $\mathcal{F}_{i,j} \in \mathbb{R}^{n_i \times k \times k}$ on the $n_i$ input channels, in which one filter generates one feature map.

Each filter is formed from $n_i$ 2D kernels $\mathcal{K} \in \mathbb{R}^{k \times k}$. All of the filters together form the kernel matrix $\mathcal{F} \in \mathbb{R}^{n_i \times n_{i+1} \times k \times k}$. The number of operations of the convolutional layer is then $n_{i+1} n_i k^2 h_{i+1} w_{i+1}$. When a filter $\mathcal{F}_{i,j}$ is pruned, the corresponding filter map $x_{i+1,j}$ is removed (e.g., when filter 108 is pruned, feature map 110 is removed). This reduces the number of operations by $n_i k^2 h_{i+1} w_{i+1}$. The kernels that apply to the removed feature maps 110 from the filters of the next convolutional layer are also removed, saving an additional $n_{i+2} k^2 h_{i+2} w_{i+2}$ operations. Pruning m filters from layer i will reduce $m/n_{i+1}$ of the computation cost for layers i and i+1.

Figure 2:
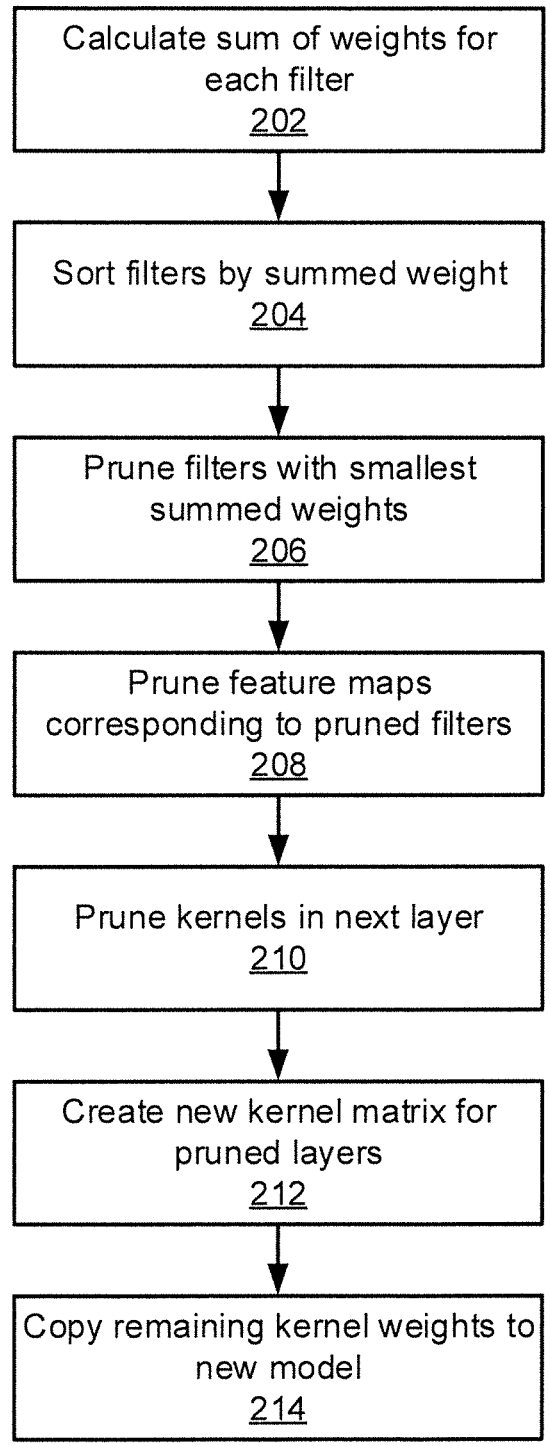
FIG. 2 is a block/flow diagram of a method for pruning filters from a CNN in accordance with the present embodiments.

Referring now to FIG. 2, a method for pruning a CNN is shown. The present embodiments prune the less useful filters 108 from a well-trained model to increase computational efficiency with a minimal accuracy drop. The relative importance of the filters 104 in each layer is measured by calculating the sum of each filter's absolute weights: $\Sigma |\mathcal{F}_{i,j}|$, otherwise written herein as the $l_1$-norm, $\|\mathcal{F}_{i,j}\|_1$. Since the number of input channels $n_i$ is the same across all filters, $\Sigma |\mathcal{F}_{i,j}|$ also represents the average magnitude of its kernel weights. This value gives an expectation of the magnitude of the output feature map.

Filters 108 with smaller kernel weights tent to produce feature maps 110 with weak activations as compared to the other filters 104 in that layer. It has been shown experimentally that pruning the smallest filters works better that pruning the same number of random filters or selecting the largest filters. Compared to other criteria for activation-based feature map pruning, the $l_1$-norm is a good criterion for data-free filter selection.

Thus, for each filter 104, block 202 calculates the sum of its absolute kernel weights as $s_j = \Sigma_{l=1}^{n_i} \Sigma |\mathcal{K}|$. Block 204 sorts the filters 104 according to their summed kernel weights $s_j$. Block 206 then prunes the m filters 108 with the smallest values for $s_j$. Block 208 prunes the feature maps 110 corresponding to the m pruned filters, and block 210 prunes the filters from the next convolutional layer corresponding to the pruned feature maps 110. Block 212 then creates a new kernel matrix for both layer i and layer i+1 and block 214 copies the remaining kernel weights to the new model.

Pruning filters with low absolute weights sums is distinct from pruning filters based solely on low-magnitudes. Magnitude-based weight pruning may prune away whole filters when all of the kernel weights of a filter are lower than a given threshold. Magnitude-based weight pruning needs careful tuning of its threshold and it is difficult to predict the number of filters that will eventually be pruned in that process.

To understand the sensitivity of each layer to pruning, each layer is pruned independently and evaluated with respect to the pruned network's accuracy. Some layers that maintain their accuracy as filters are pruned away, while other layers are more sensitive to pruning and would lose accuracy. For deep CNNs, layers in the same stage (e.g., with the same feature map size) have a similar sensitivity to pruning. To avoid introducing layer-wise meta-parameters, the same pruning ratio is used for all layers in a given stage. For layers that are sensitive to pruning, a smaller percentage of the filters are pruned. In some cases, pruning may be skipped entirely for particularly sensitive layers.

The present embodiments prune filters from multiple layers at once. For deep networks, pruning and retraining on a layer-by-layer basis can be very time consuming. Pruning layers across the network gives a holistic view of the robustness of the network, resulting in a smaller network. In particular, a "greedy" pruning accounts for filters that have been removed in previous layers without considering the kernels for the previously pruned feature maps when calculating the sum of absolute weights. In contrast, an "independent" pruning determines which filters should be pruned at each layer, independent of other layers. The greedy approach, while not globally optimal, is holistic and results in pruned networks with higher accuracy, particularly when many filters are pruned.

For simpler CNNs, any of the filters in any convolutional layer can be easily pruned. However, for complex network architectures, pruning may not be straightforward. Complex architectures may impose restrictions, such that filters need to be pruned carefully. In one example, correspondences between feature maps may necessitate the pruning of feature maps to permit pruning of a given convolutional layer.

After pruning, performance degradation should be corrected by retraining the CNN. Two strategies for pruning filters across multiple layers include, "prune once and retrain," and, "prune and retrain iteratively." In "prune once and retrain," filters of multiple layers are pruned a single time and are retrained until the original accuracy is restored. In "prune and retrain iteratively," filters are pruned layer-by-layer or filter-by-filter and then iteratively retrained. The model is retrained before pruning the next layer, allowing the weights to adapt to the changes from the pruning process.

For layers that are resilient to pruning, the "prune once and retrain" strategy can be used to prune away significant portions of the network, with any loss in accuracy being regained by retraining for even a short period of time. When some filters from the sensitive layers are pruned away, or when large portions of the network are pruned away, it may not be possible to recover the original accuracy. Iterative pruning and retraining may yield better results, but the iterative process can take up much more time, particularly for deep networks.

Embodiments described herein may be entirely hardware, entirely software or including both hardware and software elements. In a preferred embodiment, the present invention is implemented in software, which includes but is not limited to firmware, resident software, microcode, etc.

Embodiments may include a computer program product accessible from a computer-usable or computer-readable medium providing program code for use by or in connection with a computer or any instruction execution system. A computer-usable or computer readable medium may include any apparatus that stores, communicates, propagates, or transports the program for use by or in connection with the instruction execution system, apparatus, or device. The medium can be magnetic, optical, electronic, electromagnetic, infrared, or semiconductor system (or apparatus or device) or a propagation medium. The medium may include a computer-readable storage medium such as a semiconductor or solid state memory, magnetic tape, a removable computer diskette, a random access memory (RAM), a read-only memory (ROM), a rigid magnetic disk and an optical disk, etc.

Each computer program may be tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 3:
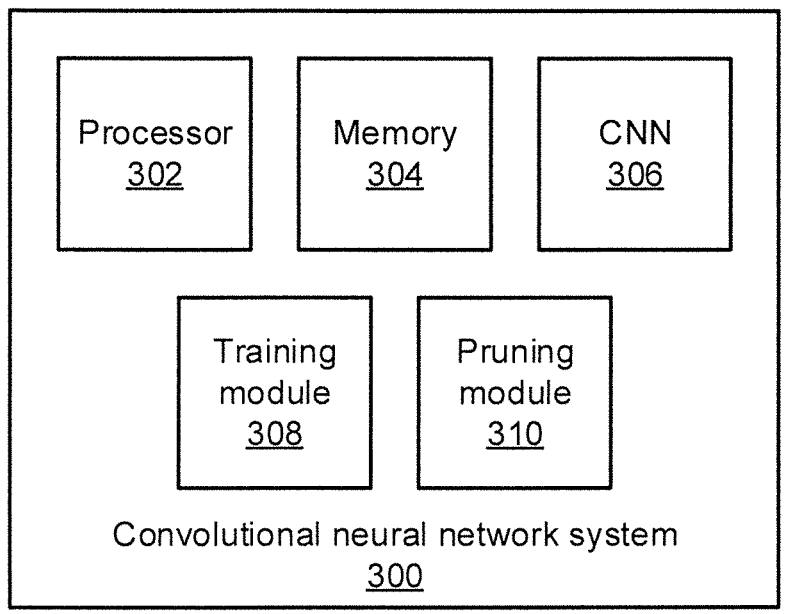
FIG. 3 is a CNN system that includes filter pruning in accordance with the present embodiments.

Referring now to FIG. 3, a CNN system 300 is shown. The system 300 includes a hardware processor 302 and memory 304. A CNN 306 is implemented either in hardware or in software. The CNN 306 takes input data and generates an output based on the filters and weights that make up the CNN's configuration. The system 300 furthermore includes one or more functional modules that may, in some embodiments, be implemented as software that is stored in the memory 304 and executed by hardware processor 302. In alternative embodiments, the functional modules may be implemented as one or more discrete hardware components in the form of, e.g., application specific integrated chips or field programmable gate arrays.

In particular, a training module 308 trains the CNN 306 based on training data. The training data includes one set of data used to train the CNN 306 and another set of data used to test the CNN 306, with differences between the outcome of the 306 and expected outcome from the testing data being used to adjust the CNN 306. A pruning module 310 prunes filters from the CNN 306 to reduce the computational complexity. The training module 308 and the pruning module 310 work together as described above, either in a prune-once implementation or in an iterative implementation, to ensure that the output of the CNN 306 is not significantly degraded by pruning.

Figure 4:
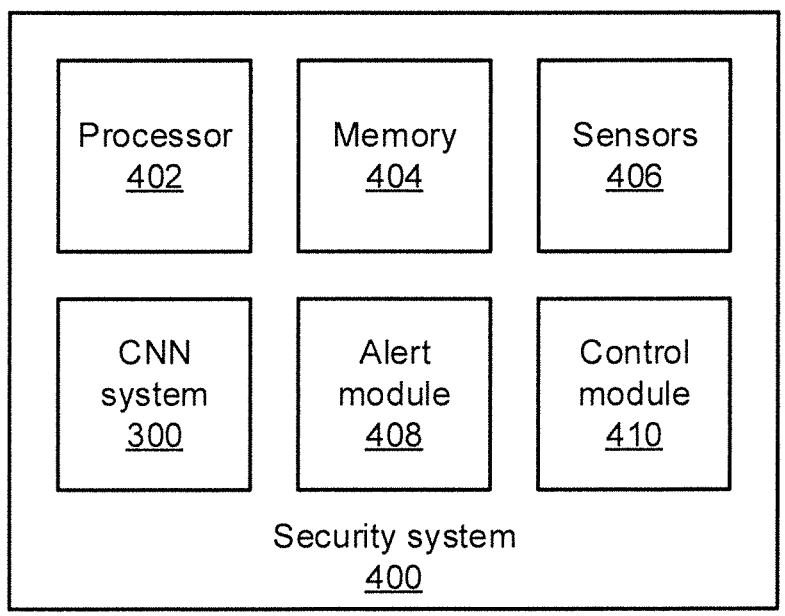
FIG. 4 is a security system based on pruned CNN classifiers in accordance with the present embodiments.

Referring now to FIG. 4, a security system 400 is shown as one possible implementation of the present embodiments. The security system 400 includes a hardware processor 402 and a memory 404. One or more sensors 406 provide data about a monitored area to the security system 400. The sensors 406 may include, for example, a camera, a night vision camera (e.g., operating in infrared), door and window sensors, acoustic sensors, temperature sensors, and any other sensors that collect raw data regarding the monitored area.

The CNN system 300 is included in the security system 400. The CNN system 300 accepts information that is gathered by the sensors 406 and stored in memory 404, outputting security status information. The CNN system 300 may include its own separate processor 302 and memory 304 or may, alternatively, omit those feature in favor of using the processor 402 and memory 404 of the security system 400.

An alert module 408 accepts the output of the CNN system 300. The alert module 408 determines if the state of the area being monitored has changed and, if so, whether an alert should be issued. For example, the CNN system 300 may detect movement or the presence of a person or object in a place where it does not belong. Alternatively, the CNN system 300 may detect an intrusion event. In such a situation, the alert module 408 provides an appropriate alert to one or more of the user and a response organization (e.g., medical, police, or fire). The alert module 408 provide the alert by any appropriate communications mechanism, including by wired or wireless network connections or by a user interface.

A control module 410 works with the alert module 408 to perform appropriate security management actions. For example, if an unauthorized person is detected by the CNN system 300, the control module 410 may automatically increase a security level and perform such actions as locking doors, increasing sensor sensitivity, and changing the sensitivity of the alert module 408.

Because the CNN system 300 has been pruned, the CNN system 300 can provide accurate results with relatively low computational complexity, making it possible to implement the security system 400 on lower-power hardware. In particular, the processor 402 need not be a high-powered device and may in particular be implemented in an embedded environment.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention. Having thus described aspects of the invention, with the details and particularity required by the patent laws, what is claimed and desired protected by Letters Patent is set forth in the appended claims.

What is claimed is:

1. A method for pruning a convolutional neural network (CNN), comprising:
    calculating a sum of kernel weights of each of a plurality of filters in a layer of the CNN;
    sorting the plurality of filters in the layer by respective sums of weights;

pruning m filters with the smallest sums of weights to decrease a computational cost of operating the CNN; and retraining the pruned CNN to repair accuracy loss that results from pruning the m filters by creating a new kernel layer matrix for the layer and copying un-pruned kernel weights to the new kernel matrix.

2. The method of claim 1, further comprising pruning feature maps corresponding to the m pruned filters.

3. The method of claim 2, pruning kernels in a subsequent layer that correspond to the pruned feature maps.

4. The method of claim 1, further comprising iterating the steps of pruning and retraining until a threshold CNN accuracy is reached.

5. The method of claim 1, further comprising selecting a number of filters m based on a sensitivity of the layer to pruning.

6. The method of claim 5, wherein a smaller m is selected for layers that have relatively high sensitivities compared to layers that have relatively low sensitivities.

7. The method of claim 5, wherein sensitivity to pruning is measured as a degree of accuracy change.

8. A method for pruning a convolutional neural network (CNN), comprising:
   calculating a sum of kernel weights of each of a plurality of filters in a layer of the CNN;
   sorting the plurality of filters in the layer by respective sums of weights;
   selecting a number of filters m based on a sensitivity of the layer to pruning, measured as a degree of accuracy change;
   pruning m filters with the smallest sums of weights to decrease a computational cost of operating the CNN;
   pruning feature maps corresponding to the m pruned filters;
   pruning kernels in a subsequent layer that correspond to the pruned feature maps; and
   retraining the pruned CNN to repair accuracy loss that results from pruning the m filters by creating a new kernel layer matrix for the layer and copying un-pruned kernel weights to the new kernel matrix.

9. A system for pruning a convolutional neural network (CNN), comprising:
   a hardware processor; and
   a memory, configured to store computer program code that, when executed by the hardware processor, is configured to execute:
      a pruning module configured to calculate a sum of kernel weights of each of a plurality of filters in a layer of the CNN, to sort the plurality of filters in the layer by respective sums of weights, and to prune m filters with the smallest sums of weights to decrease a computational cost of operating the CNN; and
      a training module configured to retrain the pruned CNN to repair accuracy loss that results from pruning the m filters by creating a new kernel layer matrix for the layer and copying un-pruned kernel weights to the new kernel matrix.

10. The system of claim 9, wherein the pruning module is further configured to prune feature maps corresponding to the m pruned filters.

11. The system of claim 10, wherein the pruning module is further configured to prune kernels in a subsequent layer that correspond to the pruned feature maps.

12. The system of claim 9, wherein the pruning module and the training module are further configured to iterate the steps of pruning and retraining until a threshold CNN accuracy is reached.

13. The system of claim 9, wherein the pruning module is further configured to select a number of filters m based on a sensitivity of the layer to pruning.

14. The system of claim 13, wherein a smaller m is selected for layers that have relatively high sensitivities compared to layers that have relatively low sensitivities.

15. The system of claim 13, wherein sensitivity to pruning is measured as a degree of accuracy change.

* * * * *